United States Patent [19]

Hansen et al.

[11] Patent Number: 4,589,006

[45] Date of Patent: May 13, 1986

[54] GERMANIUM DETECTOR PASSIVATED WITH HYDROGENATED AMORPHOUS GERMANIUM

[75] Inventors: William L. Hansen, Walnut Creek; Eugene E. Haller, Berkeley, both of Calif.

[73] Assignee: The United States of America as represented by the United States Department of Energy, Washington, D.C.

[21] Appl. No.: 667,384

[22] Filed: Nov. 1, 1984

Related U.S. Application Data

[60] Continuation of Ser. No. 410,786, Aug. 23, 1982, abandoned, which is a division of Ser. No. 188,436, Sep. 19, 1980, abandoned.

[51] Int. Cl.$^4$ ............... H01L 21/314; H01L 31/10; G01T 1/24
[52] U.S. Cl. ............... 357/29; 148/DIG. 1; 148/DIG. 58; 148/DIG. 81; 148/DIG. 158; 357/2; 357/52; 357/58; 204/192 S; 204/192 D; 427/92
[58] Field of Search ............ 357/2, 29, 54, 52; 427/92; 204/192 S, 192 D

[56] References Cited

U.S. PATENT DOCUMENTS

| | | | |
|---|---|---|---|
| 2,862,126 | 11/1958 | Ploke et al. | 358/13 |
| 3,470,426 | 10/1969 | Feldman | 357/2 |
| 3,872,492 | 3/1975 | Robbins | 357/23.7 |
| 4,151,058 | 4/1979 | Kaplan | 204/192 |
| 4,162,505 | 7/1979 | Hanak | 526/187 |
| 4,224,084 | 9/1980 | Pankove | 357/2 |
| 4,254,426 | 3/1981 | Pankove | 357/2 |
| 4,315,782 | 2/1982 | Tarng | 357/52 |
| 4,331,486 | 5/1982 | Chenevas-Paule et al. | 148/1.5 |
| 4,362,722 | 12/1982 | Dannhaeuser et al. | 357/52 |

FOREIGN PATENT DOCUMENTS 2546451 4/1976 Fed. Rep. of Germany ........ 357/29

OTHER PUBLICATIONS

Brodsky et al., IBM Tech. Disclosure Bulletin, vol. 19, No. 12, May 1977, pp. 4802–4803.
Moustakas, J. Electronic Materials, vol. 18, No. 3, 1979, pp. 391–435.

Primary Examiner—William D. Larkins
Attorney, Agent, or Firm—Clifton E. Clouse, Jr.; Roger S. Gaither; Judson R. Hightower

[57] ABSTRACT

Passivation of predominantly crystalline semiconductor devices (12) is provided for by a surface coating (21) of sputtered hydrogenated amorphous semiconductor material. Passivation of a radiation detector germanium diode, for example, is realized by sputtering a coating (21) of amorphous germanium onto the etched and quenched diode surface (11) in a low pressure atmosphere of hydrogen and argon. Unlike prior germanium diode semiconductor devices (12), which must be maintained in vacuum at cryogenic temperatures to avoid deterioration, a diode processed in the described manner may be stored in air at room temperature or otherwise exposed to a variety of environmental conditions. The coating (21) compensates for pre-existing undesirable surface states as well as protecting the semiconductor device (12) against future impregnation with impurities.

2 Claims, 10 Drawing Figures

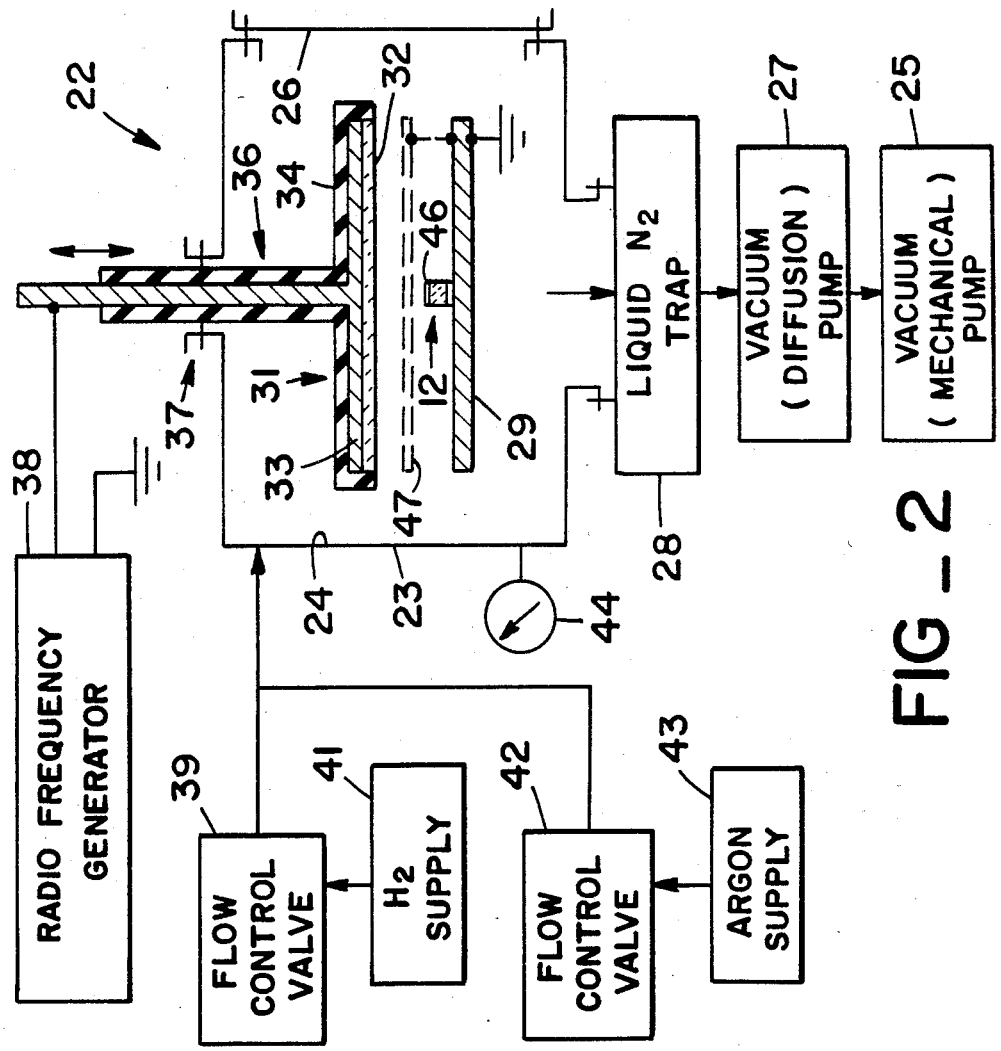

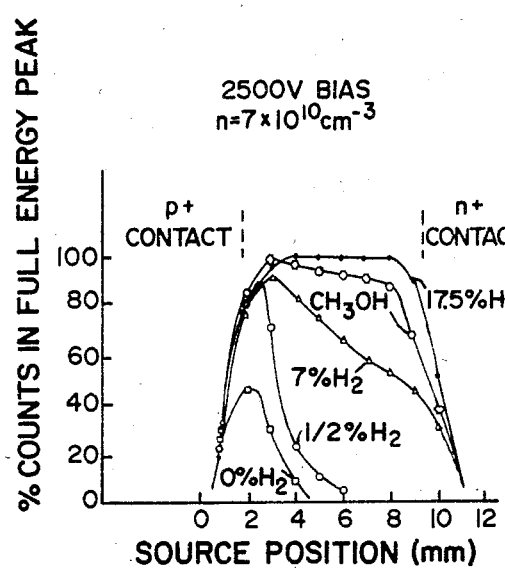
FIG_3A
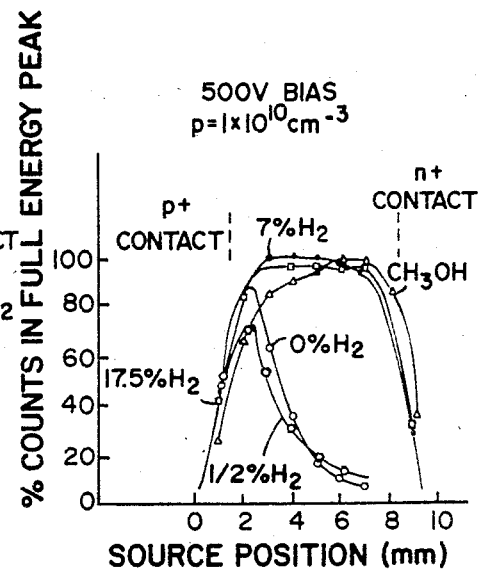
FIG_3B
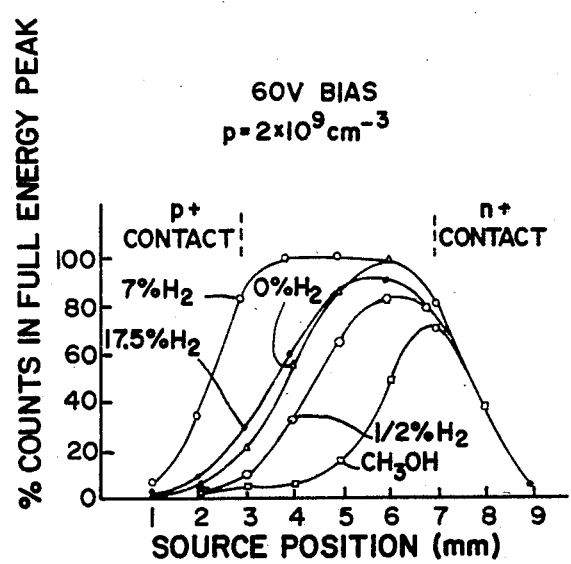
FIG_3C
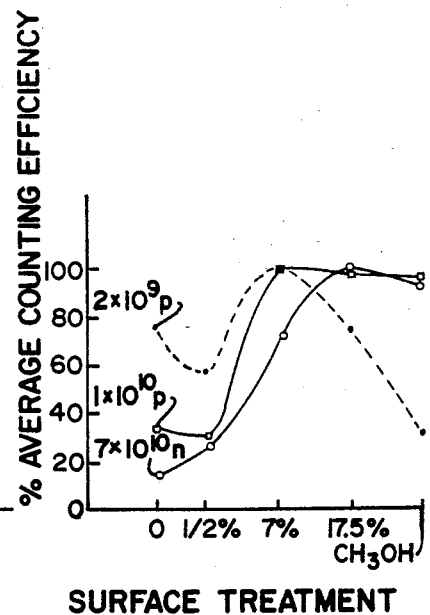
FIG_4

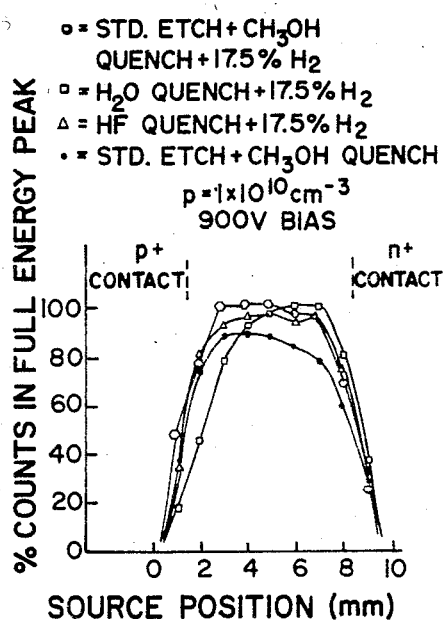
FIG_5
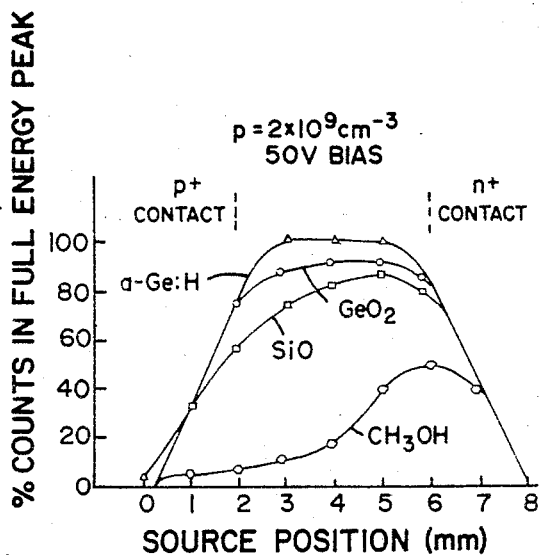
FIG_6
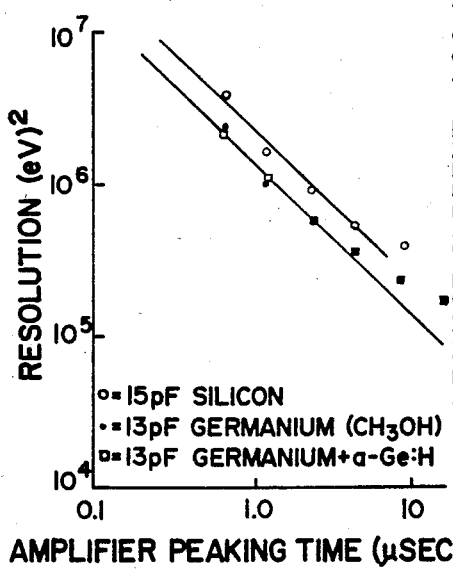
FIG_7
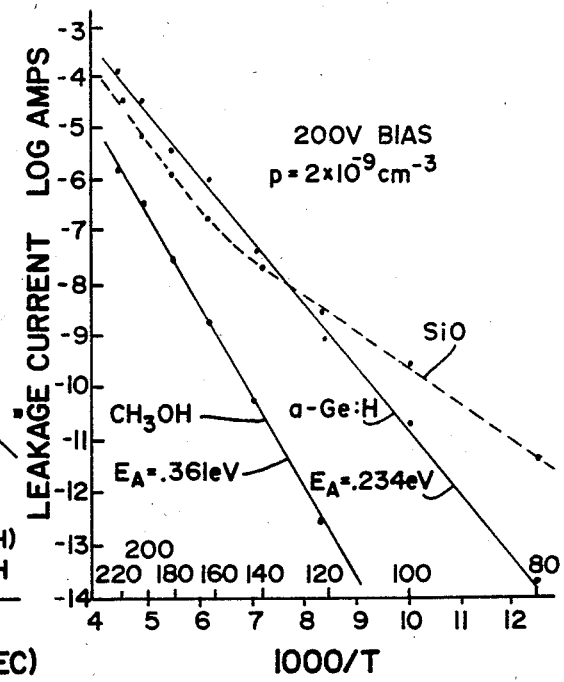
FIG_8

GERMANIUM DETECTOR PASSIVATED WITH HYDROGENATED AMORPHOUS GERMANIUM

The United States government has rights in this invention pursuant to contract number W-7405-eng-48 between the U.S. Department of Energy and the University of California.

This is a continuation of application Ser. No. 410,786 filed Aug. 23, 1982 which is a division of application Ser. No. 188,436 filed Sept. 19, 1980, both now abandoned.

BACKGROUND OF THE INVENTION

This invention relates generally to semiconductors for use in electrical circuits. More particularly, the invention relates to the correction of undesirable surface states in semiconductor devices to realize optimum performance characteristics and to the passivation and stabilization of semiconductor surfaces.

The performance of semiconductor elements in electrical circuits is often adversely affected by characteristics of the surface region of the semiconducting material. Broken or missing bonds and other undesirable conditions may be present primarily as a result of unwanted impurities or an undesirable distribution of necessary impurities that alters the electrical characteristics of the semiconductor material at the surface and, indirectly, deep into the bulk of the material as well. In a p-i-n diode for example, surface channels of n or p type material may extend from the corresponding contact region along the depletion region towards the contact region of opposite type. Adverse effects of such surface channels include excessive leakage current, low break down voltage and excess noise generation. If such a diode is used as a radiation detector, highly uneven response is exhibited in different regions of the radiation receiving volume.

Undesirable surface states may be present as a result of the introduction of impurities during manufacture of the semiconductor element or may arise later from exposure to impurities during storage or use.

Various surface treatments and encapsulation methods have been devised to provide passivation or protection against penetration by impurity atoms without, in the process, adversely affecting the performance characteristics of the material. These are not always wholly effective particularly in the case of certain semiconducting materials which have advantageous electrical properties but which are also extremely prone to develop undesirable surface states.

Germanium, for example, does not have a stable passivating native oxide which can serve as a passivating surface layer. Consequently, germanium devices have been relegated to a relatively small role in the semiconductor industry and are typically used only where the special electrical characteristics of germanium make the lack of stability tolerable and justify special handling and storage procedures. For example, germanium diodes are used for radiation detection in physics research and in medical diagnostic equipment but are found to deteriorate very quickly unless they are maintained at cryogenic temperatures in a very clean vacuum during storage and during handling as well as in use. The expense and inconvenience of maintaining these conditions, particularly during installation of the detectors is considerable. Detection systems involving a large number of such detectors are virtually impossible to fabricate and operate.

Prior efforts to protect germanium diodes from deterioration during storage or use have included the formation of a coating of silicon oxide on the surface. SiO coatings are not desirably effective for several reasons. Such coatings do not reliably compensate for pre-existing adverse surface states but are instead highly sensitive to the initial condition of the surface. In a detector diode, such coatings do not produce flat band conditions at the surface. Instead, response to radiation tends to differ in different regions near the detector surface. Further, SiO coated devices tend to exhibit high leakage current and high inverse frequency noise and the method of application, thermal evaporation, limits such coatings to surfaces of simple geometry.

Essentially similar problems are encountered in the use of certain other semiconductor materials although generally to a lesser extent.

Semiconductor circuit components are commonly formed primarily of certain elements in their crystalline form, the crystalline structure being impregnated with impurities which impart desired electrical properties. It has been recognized that thin films of similar elements, such as silicon or germanium, for example, in the amorphous state may also be used as semiconductor elements in electrical circuits. It has been further recognized that production of such films by sputtering onto an inert substrate in the presence of a controlled atmosphere of hydrogen and argon imparts desirable performance characteristics to the material as described for example by Moustakes, Journal of Electronic Materials, Volume 8, No. 3, pages 391 to 435, 1979, or by Messier et al, Journal of Vacuum Science Technology, Volume 13, No. 5, pages 1060 to 1065, Sept/Oct 1976.

Heretofore such sputtered hydrogenated amorphous semiconducting materials have been viewed essentially as substitutes for circuit components formed of the crystalline material. It has not been recognized that the hydrogenated amorphous form of a semiconducting element might be advantageously utilized in devices basically of the crystalline type to resolve the problems discussed above.

SUMMARY OF THE INVENTION

Accordingly, it is an object of this invention to provide for the protection and stabilization of the surface regions of semiconductor elements including elements of types not readily susceptible to passivation by known procedures.

It is an object of this invention to provide for passivation of semiconductor circuit elements by procedures which reliably compensate or correct preexisting undesirable surface states as well as providing protection from future deterioration.

It is another object of the invention to provide a surface passivated diode or the like without substantial adverse effects on the performance characteristics of the diode or the like.

It is still another object of the invention to enable the storage and handling in air and at room temperature of semiconductors such as crystalline germanium that have heretofore required a cryogenic vacuum environment.

Additional objects, advantages and novel features of the invention will be set forth in part in the description which follows and in part will become apparent to those skilled in the art upon examination of the following or may be learned by practice of the invention. The objects and advantages of the invention may be realized and obtained by means of the instrumentalities and combinations particularly pointed out in the appended claims.

To achieve the foregoing and other objects and in accordance with an embodiment of the invention as described herein, a method for passivating a surface of a crystalline semiconductor includes the step of coating the surface with a layer of hydrogenated amorphous semiconductor material.

In a more specific aspect, the invention provides for formation of the surface coating of amorphous semiconductor material by sputtering the material onto the surface in the presence of a hydrogen atmosphere.

In another aspect the invention provides for imparting predetermined electrical characteristics to a semiconductor device by controlling the hydrogen content of a layer of hydrogenated amorphous semiconducting material which is applied to the surface of the semiconductor.

In still another aspect, the invention provides an electrical semiconductor device having a volume of at least predominately crystalline semiconductor material with a passivating layer comprised of a coating of hydrogenated amorphous semiconducting material.

One particular embodiment of the invention provides a p-i-n germanium detector diode having a volume of crystalline germanium with a surface passivated by a layer of sputtered hydrogenated amorphous germanium.

In the preferred forms the invention facilitates the manufacture, storage and use of semiconductor devices including devices of types which have heretofore required complicated and costly storage and handling procedures such as maintenance in a vacuum at low temperatures. Surface passivation including compensation of pre-existing defects is reliably effected in semiconductors which then exhibit excellent electrical performance characteristics. Germanium diodes, for example, may be stored and handled in air at room temperatures without deterioration and may be exposed to a number of adverse environmental factors without exhibiting adverse performance characteristics such as excess leakage current, low break down voltage or deviation from a flat band condition when used for such purposes as radiation detection.

BRIEF DESCRIPTION OF THE DRAWINGS

The accompanying drawings, which are incorporated in and form a part of the specification, illustrate preferred embodiments of the invention and, together with the description, serve to explain the principles of the invention. In the drawings:

FIG. 1 is a diagrammatic view of a semiconductor device and depicts steps for forming a passivating coating on a surface thereof.

FIG. 2 is a diagrammatic view of sputtering apparatus suitable for processing a semiconductor device in accordance with the method of FIG. 1.

FIGS. 3A, 3B and 3C graphically depict variations of output counts at different points along the surface of detector diodes passivated in accordance with the method of FIG. 1, the data having been produced by scanning a uniform radiation source along the radiation receiving surfaces of the diodes. Each of FIGS. 3A, 3B and 3C present test data for diodes having different net bulk concentrations of impurity. By means of multiple curves, each of FIGS. 3A, 3B and 3C also depict variations of response produced by varying the hydrogen content of the passivating coatings.

FIG. 4 is a graph depicting measured charge collection efficiency as a function of hydrogen concentration in the sputtering chamber atmosphere for three different types of semiconductor having surface coatings prepared in accordance with the method of FIG. 1.

FIG. 5 is a graph of radiation counting efficiency at successive points along the surface of a series of similar diodes passivated in accordance with the method of FIG. 1 and differing only with respect to the surface preparation treatments which preceded application of the protective coating.

FIG. 6 is a graph of radiation counting efficiency at successive points along the surface of a semiconductor diode passivated in accordance with the method of FIG. 1 and depicting for purposes of comparison, the responses of similar diodes having other surface coatings.

FIG. 7 depicts resolution, constituting a measure of electrical noise generation, as a function of amplifier peaking time for a germanium detector diode having a conventional surface, for an otherwise similar germanium diode having a surface passivated in accordance with the method of FIG. 1 and for a silicon diode of similar capacitance.

FIG. 8 graphically depicts leakage current in a semiconductor diode, embodying the present invention, as a function of temperature and for purposes of comparison similarly depicts leakage current for semiconductor diodes having other forms of surfaces.

DETAILED DESCRIPTION OF THE INVENTION

Reference will now be made in detail to the present preferred embodiments of the invention, examples of which are illustrated in the accompanying drawings.

Referring intitially to FIG. 1, for purpose of example the invention will be described primarily with respect to passivation of a surface 11 of a semiconductor device 12 of a particular kind which is used for the detection of radiation such as gamma radiation or X radiation. The semiconductor device 12 of this example is a diode formed primarily of a volume 14 of crystalline germanium doped with impurities in the known manner to provide spaced apart n+ contact and p+ contact regions 16 and 17 respectively and having a broad depletion region, indicated by arrow 18 in FIG. 1, between the contact regions. The surface 11 extends between the contact regions 16 and 17 along the depletion region 18. The invention is also applicable to other semiconducting materials and to other types of semiconducting electrical circuit elements, examples of which will hereinafter be described.

During usage as a radiation detector, a reverse bias voltage is applied across the contact regions 16 and 17 but in the absence of radiation substantially no current flow occurs due to the absence of mobile charge carriers in the depletion region 18. Incoming radiation generates such charged carriers, electrons and holes, causing a momentary flow of current and inducing a charge on the contacts 16 and 17. This charge is transformed into a voltage step which may be amplified and detected in the manner well known in the art.

The operational performance of a detector diode of this kind is often found to be adversely affected by undesirable impurities or undesirable distributions of impurities at the surfaces of the crystalline semiconductor volume 14. This is particularly true of germanium semiconductors, as germanium does not form a protective oxide layer at the surface, but such effects are also characteristic to some extent of many other semiconductors. The undesirable surface states may be present as an after effect of the surface treatments during manufacture of the semiconductor device 12 or may arise later from coating and/or impregnation of the surface with any of a variety of impurity atoms to which the semiconductor may be exposed.

Considering a specific example of an undesirable surface state, a dead layer 20 extending from the surface 11 of FIG. 1 to the dashed electric field line 20' may be formed by the presence of an impurity which turns the surface strongly n type for example and in effect provides an n type conductive zone 19, termed a surface channel, which wholly or partially extends between the contact regions 16 and 17. Consequently the effective depletion region 18 near the surface 11 may be greatly reduced. This gives rise to the dead layer 20 along the surface 11, and to abnormally high leakage currents and electrical noise which may be detrimental to the radiation measurement. Such a detector diode does not exhibit a desirable "flat band" condition. Instead, counting efficiency varies at different locations along the surface 11.

The present invention adjusts or compensates the surface 11 to remove undesirable surface states that lead to the dead layer 20 and which might otherwise be present as a result of treatment during manufacture of the semiconductor device 12 and also passivates or protects the semiconductor device against the later development of undesirable surface states from exposure to various potential contaminants and environmental factors which might otherwise give rise to the later development of surface channels 19 or the like.

In the method of the invention, the crystalline bulk material 14 may be manufactured in the conventional manner, for example by growing a germanium crystal from a melt and doping the contact layers 16 and 17 with appropriate impurity. Following production of the contacts 16 and 17 on the bulk material volume 14, the surface 11 may be etched and quenched also using known techniques and materials. For example etching may be performed with a mixture of nitric acid and hydrofluoric acid in a 4:1 ratio followed by quenching with methanol ($CH_3OH$) afterwhich the surface 11 may be blown dry with nitrogen gas. This known surface treatment produces what will hereinafter be termed a "standard surface". Heretofore the standard surface as often been found to exhibit undesirable surface states notwithstanding very careful precautions in the preparation of the surface. Further, such surfaces are subject to rapid contamination and deterioration upon exposure to a large number of ambient influences including, in some cases, exposure to air at ordinary room temperatures.

In order to protect and passivate the surface 11 in accordance with the present invention, the etching and quenching steps are followed by formation on the surface 11 of a coating or layer 21 of hydrogenated amorphous semiconductor material, hydrogenated amorphous germanium or silicon being suitable examples. As will hereinafter be described in more detail, the layer 21 is preferably formed by sputtering the semiconducting material onto the surface 11 in a low pressure atmosphere of hydrogen and a noble gas such as argon.

As will also be discussed in more detail the hydrogen content of the coating 21 plays an important role in compensating and passivating the semiconductor surface 11 and the optimum hydrogen content for such purpose is dependent on the bulk net impurity concentration in the crystalline volume 14 of the semiconductor 12. Formation of the coating 21 by sputtering allows control of the hydrogen concentration to realize optimum electrical characteristics within the semiconductor 12.

FIG. 2 diagrammatically illustrates suitable sputtering apparatus 22 for coating the surfaces of a semiconductor diode 12 of the like in the above described manner. The sputtering apparatus 22 may have a housing 23 defining a vacuum chamber 24, the housing having a door 26 which may be opened to provide access to the vacuum chamber. A mechanical vacuum pump 25 and a high vacuum pump 27 which is preferably of the diffusion type are communicated with the chamber 24 through a cold trap 28 of the liquid nitrogen form in this instance. Within chamber 24, a circular conductive anode plate 29 is situated below a cathode assembly 31 of similar configuration.

Cathode assembly 31 includes a layer 32 of the semiconductor material, such as germanium or silicon for example, which is to be sputtered onto the diode 12 and which is disposed on the underside of an electrically conductive cathode plate 33 that has a layer of electrical insulation 34 on the upper and side surfaces. An insulated conductive cathode support rod 36 extends up through a sliding vacuum seal 37 in the wall of housing 23 to enable connection of the cathode plate 33 to a high voltage radio frequency generator 38 and to enable raising and lowering of the cathode assembly 31 during operation in order to selectively adjust the spacing of the cathode assembly 31 and anode plate 29. Control of the process atmosphere within the chamber 24 is provided for by a first flow control valve 39 connected between a hydrogen gas supply 41 and chamber 24 and a second control valve 42 connected between the chamber 24 and an argon gas supply 43. Pressure indicating means 44 are connected to the chamber 24 to facilitate control of the vacuum pressure within the chamber by coordinating valves 39 and 42 with the pumping rate of vacuum pump 27.

Referring now to FIGS. 1 and 2 in conjunction, in the practice of the method of the invention to produce a semiconductor device 12 having a stabilized passivated surface 11, manufacture of the impurity doped crystalline bulk 14 of a device and etching and quenching of the surface 11 may if desired be performed using known procedures and therefore will not be further described. Following such fabrication, the surface 11 may for example be the methanol quenched standard surface as hereinbefore described.

Through door 26, the semiconductor device 12 is then placed on anode plate 29 with the contact surfaces 16 and 17 which are not to be coated being covered with a layer of removable material 46 such as indium foil and with the surfaces 11 which are to be coated being exposed to the open region between the anode plate 29 and cathode assembly 31.

As control of the hydrogen content of the coating layer 21 which is applied to the semiconductor device 12 enables realization of the desired electrical properties, care should be taken to avoid an uncontrolled introduction of hydrogen from water which may be adsorbed on the surface of the semiconducting material 32 or on other portions of the apparatus. Water degassing for this purpose may be performed by temporarily placing a shutter plate 47 over the semiconductor device 12 between the anode plate 29 and cathode assembly 31, the shutter plate being electrically connected to the anode plate to act as a temporary anode during the degassing operation. Chamber 24 is then evacuated by operation of pumps 25 and 27 after which radio frequency generator 38 is actuated to establish a glow discharge between the shutter plate 47 and the cathode assembly 31. Water is thereby desorbed from the cathode assembly 31 and other elements of the apparatus and is removed from the chamber by pump 27 and trap 28.

Follow degassing, radio frequency generator 38 is temporarily deactivated and shutter plate 47 is removed from the region between anode plate 29 and cathode assembly 31. While this operation can be facilitated if the sputtering apparatus 22 is of a form having external manipulating means enabling withdrawal or opening of the shutter plate 47 without repressurization of the chamber 24 and opening of gate 26, this is not essential. It has been found that the properties of the semiconductor 12 are not significantly affected if the chamber 24 is briefly repressurized at this stage to enable opening of gate 26 for removal of shutter plate 47.

A controlled atmosphere of hydrogen and argon at low sputtering pressure is then established in the chamber 24 by adjusting flow control valves 39 and 42 to balance the rate of gas removal by pumps 25 and 27 and trap 28, examples of suitable specific pressures and hydrogen content being hereinafter given. Radio frequency generator 38 is then again actuated to cause a glow discharge between the cathode 31 and anode 29. A coating of amorphous semiconducting material from the layer 32 of the cathode is then built up on the exposed surfaces 11 of the semiconductor device 12. As is understood by those skilled in the art, the glow discharge produces gas ions which are accelerated by the electrical field and impinge upon the cathode layer 32 with sufficient energy to release atoms of the semiconducting material of the layer 32. The freed atoms then drift through the region between the cathode 31 and anode 29 and form deposits on adjacent surfaces including, in this instance, on the exposed surfaces of the semiconductor device 12.

The coating 21 of semiconductor material formed on the exposed surfaces of the device 12 is in the amorphous or noncrystalline form and also contains bound hydrogen atoms in a proportion which is controllable by control of the hydrogen content of the process atmosphere in chamber 24 during the sputtering operation. The advantageous effect of the hydrogen content of the coating on the electrical properties of the semiconductor device 12 is believed to result from compensation by attachment of hydrogen atoms to the missing or broken bonds which give rise to undesirable surface states in a semiconductor. The purpose of the argon or other noble gas in the process atmosphere is to enable optimum sputtering pressures to be maintained since the preferred concentration of hydrogen gas for hydrogenation of the coating 21 may not correspond to the optimum gas pressure for establishing the electrical discharge between cathode 31 and anode 29.

The sputtering operation is continued for a period sufficient to build up a coating 21 on the semiconductor device 12 of desired thickness. The electrical properties of the semiconductor device 12 are not particularly sensitive to the thickness of the coating 21, coating thicknesses ranging from 300 angstrom units to 30,000 angstrom units having been found to produce no significant differences in the electrical performance of the semiconductor device 12. Thus at least within this range, coating 21 thicknesses may be selected on the basis of other considerations. As one example, amorphous hydrogenated germanium coatings more than one micromillimeter thick are opaque to visible light and thus will allow semiconductor diode radiation detectors to be operated without further provisions for excluding interference from light.

After a coating 21 of the desired thickness has been deposited on the semiconductor device 12, radio frequency generator 38 and vacuum pump 27 are shut down and the chamber 24 is raised to atmospheric pressure to enable removal of the passivated semiconductor device 12. The coatings 21 produced by this process have been found to be highly uniform and such coatings may in fact be applied to negative relief surfaces.

The coating 21 of hydrogenated amorphous semiconductor material is found to remove preexisting undesirable surface states, such as dead layer 20, at the surface 11 of the diode 12 and the coating further prevents subsequent development of such surface states from penetration of the surface by undesired impurities to which the semiconductor device 12 may be exposed. The desired electrical performance characteristics of the semiconductor device 12 are thus more reliably realized and are stabilized against deterioration from adverse environmental conditions to which the device may be exposed.

Considering a specific example of preparation of a surface passivated semiconductor device in accordance with the above described method, a detector diode 12 fabricated from n-type germanium having a bulk net impurity concentration of $7 \times 10^{10}$ cm$^{-3}$ and having a depletion region approximately 8 millimeters in length was initially prepared with standard surfaces 11 as hereinbefore defined. The diode 12 was then placed n+ contact down on an anode plate 29 of 27 centimeters diameter with indium foil 46 being between the diode and the anode and with the upper or boron side also being partially covered with indium foil. The cathode 31, of 20 centimeters effective diameter, included a layer 32 of germanium facing the anode 29. The vacuum pump 27 was an oil diffusion pump having an effective inside diameter of 15 centimeters and was communicated with the sputtering chamber 24 through a liquid nitrogen trap 28 having an inside diameter of 20 centimeters. Water degassing was conducted for 5 minutes with the diode 12 covered by a shutter 47. Thereafter shutter protection of the diode was eliminated, the anode 29-cathode 31 spacing was adjusted to be 5 centimeters and the gas pressure within the chamber 24 was adjusted to be 7 micromillimeters of mercury, the chamber gas consisting of 17.5% hydrogen with the remainder being argon. Radio frequency generator 38 operated at 13.56 megahertz and applied 1.1 kV peak voltage across the cathode 31 and anode 29 at a power input of 300 W. The generator 38 was operated for a period of 5 minutes and produced a coating 21 of sputtered hydrogenated amorphous germanium on the exposed surfaces of the diode 12 which was 3,000 angstrom units thick.

The curve labeled 17.5%H$_2$ in FIG. 3A depicts the electrical performance of a detector diode processed as described in the above given example. For purposes of comparison, FIG. 3A also depicts the results of performance testing of otherwise similar germanium diodes subjected to other surface treatments. Curve 17.5%$H_2$ and the other curves shown in FIG. 3A were produced by connecting the diode into a conventional radiation detection circuit and then scanning a relatively thin collimated beam of gamma radiation of constant intensity across the coated surface of the diode from one contact region to the other while recording the number of radiation counts per unit time detected at successive positions along the scan.

The curves labeled 0% $H_2$, $\frac{1}{2}$% $H_2$ and 7% $H_2$ in FIG. 3A shows the results of similar scanning of diodes processed identically with the processing of the diode described in the above given example except insofar as the percentage of hydrogen in the sputtering atmosphere was as indicated in the Figure instead of being 17.5% as in the case of curve 17.5%$H_2$. The curve labeled $CH_3OH$ depicts the results of a similar scanning of a diode having an unpassivated standard surface as hereinbefore defined but otherwise being similar to the diode of the above described example. As is evident from FIG. 3A, curve 17.5% $H_2$ indicates a flat band condition indicative of the absence of any dead layer. The absence of a dead layer not only increases the full energy peak efficiency but also leads to less counts below the full energy peak or, in other words, to a cleaner energy spectrum.

The passivating coating produced in accordance with the invention not only corrects for adverse preexisting surface states but also protects against deterioation from subsequent ambient influences. Surface treatments which have been found to have no appreciable effect on the electrical performance of such treated diodes include 3 months storage in air at room temperatures and pressures, a washing in methanol and heating to 300° C. in argon for 10 minutes.

As is apparent from the data of FIG. 3A, the electrical performance of the coated semiconductor device is affected by the hydrogen content of the atmosphere in which the sputtering is performed, a hydrogen content of 17.5% being appropriate for the diode of the above described example. It has been found that differing hydrogen concentrations produce optimum performance in semiconductors of different bulk net impurity concentration. FIG. 3B for example depicts the results of similar scannings of diodes having surfaces subjected to the same treatments as the diodes which produce the data of FIG. 3A except that the diodes used to obtain the data of FIG. 3B were fabricated of p type germanium having a bulk net impurity concentration of $1 \times 10^{10}$ cm$^{-3}$. As may be seen, a hydrogen concentration of 7% in the sputtering chamber atmosphere produces the diode with the best electrical characteristics in this instance although the diodes processed in a hydrogen concentration of 17.5% differ only slightly with respect to such characteristics.

FIG. 3C depicts the results of similar scans of diodes subjected to surface treatments similar to those of FIG. 3A and FIG. 3B except that the diodes used to obtain the data for FIG. 3C were fabricated from p type germanium having a bulk net impurity concentration of $2 \times 10^9$ cm$^{-3}$. In the case of FIG. 3C, the diode having a passivating coating sputtered in an atmosphere containing 7% hydrogen exhibits a more perfect band condition than any of the diodes subjected to any of the other surface treatments.

Thus there is an optimum hydrogen concentration, for the sputtering chamber atmosphere, to achieve desirably flat band conditions for each bulk net impurity concentration in the semiconductor which optimum concentration may readily be ascertained by testing. FIG. 4 depicts the effect of varying hydrogen concentration in the sputtering chamber atmosphere on charge collection efficiency of three diodes of different type and bulk net impurity concentration, the curves having been obtained by scanning of a number of diodes processed in atmospheres of different hydrogen content in the manner previously described except that in FIG. 4 the collection efficiencies have been averaged over the total scan. In general, the collection efficiencies for diodes having passivating coatings prepared as herein described tend to rise as the hydrogen content of the sputtering chamber atmosphere is increased above $\frac{1}{2}$% and tend to decline but often only slightly as the hydrogen content rises above some higher value which differs considerably among the different semiconductors. The reason why some of the curves of FIG. 4 turn up near zero $H_2$ concentration is due to the channel or dead layer becoming so strongly conducting that the charge collected in the channel is transferred to the adjacent contact in times shorter than the amplifier time constant and thus appears in the full energy peak. This observation is verified by the fact that as the detector bias is increased and the channel depleted, the counting efficiency decreases.

Hydrogenation of the passivating coating of amorphous semiconductor in accordance with the invention minimizes the effects of differing prior treatments of the semiconductor surface. FIG. 5 depicts the results of scans of three diodes formed of p type germanium having a bulk net impurity concentration of $1 \times 10^{10}$ cm$^{-3}$ each of which was provided with a passivating coating of hydrogenated amorphous germanium in accordance with the herein described method and in which a hydrogen concentration of 17.5% in the sputtering atmosphere was used in each case, the diodes differing only with respect to the fact that each had been subjected to a different surface preparation treatment as indicated in the drawing. For purposes of comparison FIG. 5 also depicts the results of a scan of an unpassivated but otherwise similar diode having the hereinbefore described standard surface. As is evident from FIG. 5, the magnitude and flatness of the response of each of the diodes passivated in accordance with the present invention is relatively high compared with that of the standard surface. Moreover, passivation by coating with hydrogenated amorphous semiconductor may be seen to be largely insensitive to the condition of the surface before the sputtering step. Only the curve for the water quenched surface shows indications of a surface channel and it is a slight one which could be compensated for by reducing the hydrogen concentration in the sputtering atmosphere.

FIG. 6 depicts the results of similar scans of four similar diodes formed of p type Germanium having a bulk net impurity concentration of $2 \times 10^9$ cm$^{-3}$ except that one of the diodes had a passivating coating of hydrogenated amorphous germanium produced in accordance with an embodiment of the present invention while another had a coating of germanium oxide and still another had a coating of silicon oxide, the fourth diode being unpassivated and having the standard $CH_3OH$ quenched surface as hereinbefore defined. The germanium oxide coating was produced by reactive sputtering in an argon atmosphere containing 10% oxygen while the silicon oxide coating was produced by thermal evaporation. As may be seen in FIG. 6, the diode passivated in accordance with the present invention has a clearly superior response efficiency and a flatter response across the surface of the diode. While the germanium oxide coated diode exhibits a fairly flat response, the count level along the treated surface is substantially below that of the diode processed in accordance with the present invention which condition is indicative of a dead layer of fairly constant thickness. This is believed to be indicative of a negative excess charge near the p+ contact and a positive excess charge near the n+ contact. As may be seen the silicon oxide coated diode and the diode with the standard surface exhibit markedly lower and more uneven radiation detection efficiency.

Electrical noise production by semiconductor devices passivated in accordance with emobiments of the present invention is comparable to that of the very best similar devices having standard surfaces. FIG. 7 depicts the noise level of a large high quality planar semiconductor device having the hereinbefore standard surface and also the noise level of the same diode after being provided with a passivating coating of hydrogenated amorphous germanium in accordance with an embodiment of the present invention. In particular, FIG. 7 is a graph of measured signal resolution, plotted against amplifier peaking time. The curve is drawn with a slope of one which is the theoretical noise behavior in the absence of inverse frequency noise. For purposes of comparison the noise behavior of a silicon detector of nearly equal capacitance is also shown in FIG. 7. The lower noise level for the germanium device is due to the smaller energy per electron-hole pair for germanium than for silicon.

Semiconductor devices having a passivating coating in accordance with embodiments of the present invention tend to exhibit somewhat more reverse leakage current than similar devices having an uncoated or standard surface and the difference becomes progressively greater at higher temperatures as depicted graphically in FIG. 8. The hereinbefore described advantages of devices passivated in accordance with embodiments of the invention offset this relatively greater leakage current in a majority of applications except in certain specialized operations where high temperatures may be present. For example, the increased leakage current may limit the use of devices coated in accordance with embodiments of the present invention to a maximum operating temperature of about 120° K. for high resolution gamma ray spectroscopy whereas a comparable bare or standard surface device could operate at 160° K. provided that surface contamination can be avoided by special measures. For purposes of comparison, the dashed curve of FIG. 8 depicts leakage current as a function of temperature for a similar detector coated with silicon oxide. Leakage current in the detector coated with hydrogenated amorphous germanium is slightly greater than that of SiO coated device at the higher temperatures but becomes progressively lower than that of the SiO device at progressively lower temperatures.

While certain specific aspects of the invention have been described primarily with reference to passivation of germanium semiconductors, a coating of hydrogenated amorphous germanium is also effective for similar purposes on crystalline semiconductors formed of other material such as silicon for example. Similarly, hydrogenated amorphous coatings of other semiconductor material have been found to exhibit similar beneficial effects. For example, a surface coating of sputtered hydrogenated amorphous silicon on a germanium semiconductor circuit element provides passivation and stabilization essentially similar to that of coatings of amorphous germanium as previously described. The amorphous silicon coating can be adjusted to compensate adverse surface states over the range of crystal bulk net impurity concentrations of interest by adjusting the hydrogen concentration in the sputtering gas in a manner essentially similar to that herein described with respect to the formation of passivating coatings of amorphous germanium.

Protective coatings of hydrogenated amorphous semiconductor material similar to those herein described have similar beneficial effects on semiconductor devices other than diodes. such coatings may be applied by the same techniques to a variety of transistors and to surface regions of monolithic integrated circuits which require passivation.

The foregoing description of preferred embodiments of the invention has been presented for purposes of illustration and description. It is not intended to be exhaustive or to limit the invention to the precise form disclosed, and modifications and variations are possible in light of the above teaching. The described embodiments were chosen and described in order to best explain the principles of the invention and its practical application and thereby enable others skilled in the art to best utilize the invention in various embodiments and with various modifications as are suited to the particular use contemplated. It is intended that the scope of the invention be defined by the claims appended hereto.

We claim:

1. An electrical semiconductor device having a volume of crystalline germanium semiconductor material of predetermined bulk net impurity concentration and having a passivating layer on a surface of said volume of crystalline germanium semiconductor material wherein said passivating layer is a coating comprised of hydrogenated amorphous germanium, said coating having a composition similar to that which is deposited on said surface by sputtering of germanium in an atmosphere of controlled hydrogen content which atmosphere has a pressure of about 7 micromilliliters of mercury and a hydrogen content selected to be in the range of about 7% to about 17.5%, said passivating layer having a hydrogen content selected to passivate undesirable surface states in said crystalline material of said predetermined bulk net impurity concentration.

2. A p-i-n germanium detector diode having a volume of crystalline germanium semiconductor material and which includes a first contact region of p type material, a second contact region of n type material and a depletion region therebetween and having a surface spanning said depletion region, further including a protective coating on said surface which is comprised of sputtered hydrogenated amorphous germanium, said coating having a composition similar to that which is deposited on said surface by sputtering of germanium in an atmosphere of controlled hydrogen content which atmosphere has a pressure of about 7 micromilliliters of mercury and a hydrogen content selected to be in the range of about 7% to about 17.5%, said coating having a hydrogen content selected to passivate undesirable surface states in said crystalline germanium semiconductor material.

* * * * *